US008273232B2

(12) United States Patent  
Okamoto et al.

(10) Patent No.: US 8,273,232 B2  
(45) Date of Patent: Sep. 25, 2012

(54) COPPER FILLING-UP METHOD

(75) Inventors: Naoki Okamoto, Osaka (JP); Kazuo Kondo, Osaka (JP); Hideyuki Kuri, Osaka (JP); Masaru Bunya, Fukushima (JP); Minoru Takeuchi, Tokyo (JP)

(73) Assignees: Osaka Prefecture University Public Corporation, Osaka (JP); Nitto Boseki Co., Ltd., Fukushima (JP)

( * ) Notice: Subject to any disclaimer, the term of this patent is extended or adjusted under 35 U.S.C. 154(b) by 368 days.

(21) Appl. No.: 12/753,530

(22) Filed: Apr. 2, 2010

(65) Prior Publication Data

US 2010/0255269 A1   Oct. 7, 2010

(30) Foreign Application Priority Data

Apr. 3, 2009   (JP) .................................. 2009-091012

(51) Int. Cl.  
  *C25D 5/02* (2006.01)
(52) U.S. Cl. .......................... 205/118; 205/291; 205/297
(58) Field of Classification Search .................. 205/118, 205/125, 291, 297  
  See application file for complete search history.

(56) References Cited

U.S. PATENT DOCUMENTS

2004/0187731 A1*   9/2004   Wang et al. .................. 106/1.13  
2005/0045486 A1    3/2005   Sahoda et al.

FOREIGN PATENT DOCUMENTS

| JP | 2001-73183 |   | 3/2001 |
|---|---|---|---|
| JP | 2001-200386 |   | 7/2001 |
| JP | 2005-29818 |   | 2/2005 |
| JP | 2006045621 A | * | 2/2006 |
| JP | 2007-138265 |   | 6/2007 |

OTHER PUBLICATIONS

Hashiba et al, "Multi-layer Buildup Board with Cu Filled Vias", Fujikura Technical Review, vol. 108, pp. 31-34.

* cited by examiner

*Primary Examiner* — Luan Van  
(74) *Attorney, Agent, or Firm* — Nixon & Vanderhye P.C.

(57) ABSTRACT

A method of filling copper in a non-through hole on a substrate that has been treated to render it conductive, which comprises plating said substrate in an acidic copper plating bath comprising a water-soluble copper salt, sulfuric acid and a filling additive that is a polymer having the activities of both of a brightener and a leveler.

7 Claims, 4 Drawing Sheets

COPPER FILLING-UP METHOD

This application claims priority to Japanese Application No. 2009-91012 filed Apr. 3, 2009, the entire content of which is hereby incorporated by reference.

FIELD OF THE INVENTION

This invention relates to a copper filling-up method, and more specifically it relates to a method for filling copper in a non-through hole on a substrate that has been treated for rendering it conductive.

TECHNICAL BACKGROUND

In recent years, the downsizing and performance-enhancement of electronic instruments or machines such as cellphones, notebook computers, liquid crystal televisions, etc., are proceeding at a rapid pace. For making these electronic instruments or machines, there are employed techniques such as wiring formation of internal printed circuit boards (PCB), wafer level package (WLP) and micro electro mechanical system (MEMS) package, three-dimensional stacking technique, etc. There is an electroplating method employed for buildup substrates which are printed circuit boards or multilayer-structured printed circuit boards among substrates to which the above wiring formation is applied, and it is a via filling technology.

The electroplating method has an advantage that the cost therefor is low since it uses a simple apparatus as compared with a vacuum vapor deposition method. Further, copper has excellent metallic properties that it has high electric conductivity and heat dissipation property, and it can be said to be a metal material suitable for connection of the wiring formation. For the wiring formation of the above printed circuit board, etc., there is used the technique of hole-plugging plating.

In the via filling technology, when buildup substrates are stacked as package substrates inside a device, desirably, a plating layer is deposited as a layer that is as thin as possible and as smooth as possible outside a non-through hole such as a via hole (fine hole) or a trench (fine groove) (that is, a plating-inhibiting effect is desirable) for facilitating chemical mechanical polishing (CMP). On the other hand, a bottom portion of the non-through hole is required to be brought into a state where it is fully filled with a deposited plating by the promotion of deposition of a plating for securing high conductivity. That is, it is preferred to produce a plating promotion effect for causing no void (see Non-Patent Document 1).

In the via filling technology, these contradicting plating effects are required for plating the bottom and outer portion of a non-through hole as described above, so that a plating bath to be used is required to contain four additives having various effects in addition to a basic composition containing copper sulfate and sulfuric acid (see Patent Documents 1~3). As the above additives, four additives of a brightener, a carrier, a leveler and chloride ion are known.

The brightener is a plating promoter, and includes organic sulfur compounds such as bissulfoalkane sulfonate, sulfoalkyl sulfonate, a dithiocarbamic acid derivative, bis-(sulfoalkyl)disulfide salt, etc.

The carrier is a plating inhibitor that is adsorbed on a copper surface to inhibit an electro deposition reaction, and it includes polyethylene glycol, polypropylene glycol, a copolymer of ethylene glycol and propylene glycol, etc.

The leveler is a plating inhibitor that is adsorbed on a copper surface to inhibit electro deposition like the carrier. It includes thiourea, benzotriazole, poly(N-vinyl-N-methylimidazolium chloride), poly(N-vinylpyrolidone), poly(diallyldimethylammonium chloride), Janus green•B, etc.

The chloride ion works to promote anode dissolution and inhibit the occurrence of anode slime.

However, when a plurality of these additives are co-present in the plating bath, the additives are consumed in different proportions as the plating is carried out, so that the amount ratio of the additives in the plating bath changes with time. In the via filling technology using a plating bath containing a plurality of additives, therefore, it is difficult to maintain the plating layer properties and plugging property at constant level, and there is involved a problem that it requires complicated formulation of the additives and troublesome control of concentrations to overcome the above situation (see Patent Document 4).

[Prior Art Documents]
  [Non-Patent Documents]
    [Non-Patent Document 1]
    Fujikura Technical Review, Vol, 108, pages 31-34
  [Patent Documents]
    [Patent Document 1]
    JP 2001-200386 A
    [Patent Document 2]
    JP 2005-29818 A
    [Patent Document 3]
    JP 2007-138265 A
    [Patent Document 4]
    JP 2001-73183 A

SUMMARY OF THE INVENTION

Problems to be Solved by the Invention

Under the circumstances, it is an object of this invention to provide a method of well filling copper in non-through holes on a conductivity-rendered substrate with a copper plating bath containing fewer additives.

Means to Solve the Problems

This invention has been made to overcome the above technical problem, and provides (1) a method of filling copper in a non-through hole on a substrate that has been treated to render it conductive, which comprises plating said substrate in an acidic copper plating bath comprising a water-soluble copper salt, sulfuric acid and a filling additive that is a polymer having the activities of both of a brightener and a leveler, (2) the method of filling copper as recited in the above (1), wherein said filling additive is a copolymer of diallylmethylamine addition salt and sulfur dioxide, the copolymer comprising a diallylmethylamine addition salt constituent unit of the general formula (I),

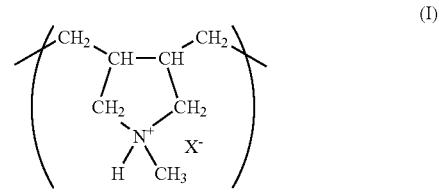

wherein X⁻ is a counter ion, and a sulfur dioxide constituent unit of the formula (II),

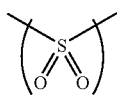
(II)

(3) the method of filling copper as recited in the above (1) or (2), wherein said acidic copper plating bath substantially does not contain at least one selected from a brightener, a carrier and a leveler besides said filling additive, (4) the method of filling copper as recited in any one of the above (1) to (3), wherein said acidic copper plating bath contains over 100 g/L but 200 g/L or less of copper sulfate as water-soluble copper salt and 100 g/L to 300 g/L of sulfuric acid, (5) the method of filling copper as recited in any one of the above (1) to (4), wherein said non-through hole is a via hole, (6) the method of filling copper as recited in any one of the above (1) to (5), wherein said via hole has a hole diameter of 30 μm to 300 μm and has an aspect ratio (hole depth/hole diameter) of 0.3 to 1.5, (7) the method of filling copper as recited in the above (2), wherein $X^-$ in said general formula (I) is chloride ion, (8) the method of filling copper as recited in any one of the above (1) to (7), wherein said acidic copper plating bath contains no chloride ion, (9) a substrate having a non-through hole filled with copper, produced by the method recited in any one of the above (1) to (8),

(10) an acidic copper plating bath for filling copper in a non-through hole on a substrate that has been treated to render it conductive, which comprises a water-soluble copper salt, sulfuric acid and a filling additive that is a polymer having the activities of both of a brightener and a leveler, and

(11) a filling additive which is a polymer having the activities of both of a brightener and a leveler and which is used in an acidic copper plating bath for filling copper in a non-through hole on a substrate that has been treated to render it conductive.

Effect of the Invention

According to the method of filling copper, provided by this invention, copper can be well filled in a non-through hole on a conductivity-rendered substrate with a copper plating bath containing fewer additives. Therefore, the concentration of the additives in the copper plating bath can be easily controlled, and copper can be efficiently filled in a non-through hole on a substrate.

PREFERRED EMBODIMENTS OF THE INVENTION

Figure 1:
FIG. 1 is a photograph of a cross section of a copper plating when copper was filled in a non-through hole on a substrate by the use, as an additive, of a 1:1 copolymer (molecular weight 4,000) of diallylmethylamine hydrochloride and sulfur dioxide in Example 1.

The method of filling copper in this invention is a method of filling copper in a non-through hole on a conductivity-rendered substrate, which comprises plating said substrate in an acidic copper plating bath comprising a water-soluble copper salt, sulfuric acid and a filling additive that is a polymer having the activities of both of a brightener and a leveler.

The substrate which this invention employs as a copper-filling object is a substrate that has been treated to render it conductive and that has non-through holes such as a via hole, a trench, etc., thereon. The treatment for rendering the substrate conductive is carried out by a conventional method, for example, by subjecting the substrate to electroless metal plating or sputtering.

The substrate having a via hole is suitably a substrate of which the non-through hole is a via hole having a hole diameter of 30 μm to 300 μm and an aspect ratio (hole depth/hole diameter) of 0.3 to 1.5. The substrate is a substrate for a printed circuit board, and specifically includes a package substrate on which an IC bare chip is to be directly mounted, etc. The substrate may have a through hole in addition to a non-through hole.

In this invention, the acidic copper plating bath to be used for filling copper in a non-through hole on a conductivity-rendered substrate, i.e., for plating copper, has a basic composition of a water-soluble copper salt and sulfuric acid, and contains, as an additive, a filling additive that is a polymer having the activities of both of a brightener and a leveler.

As the water-soluble copper salt, any water-soluble copper salt can be used without any special limitation so long as it is a water-soluble copper salt that is generally used in a plating bath. Examples thereof include inorganic copper salt, copper alkanesulfonate, copper alkanolsulfonate, and organic acid copper salt. Examples of the inorganic copper salt include copper sulfate, copper oxide, copper chloride and copper carbonate. Examples of the copper alkanesulfonate include copper methanesulfonate, copper propanesulfonate, etc. Examples of the copper alkanolsulfonate include copper isethionate, copper propanolsulfonate, etc. Examples of the organic acid copper salt include copper acetate, copper citrate, copper tartarate, etc. These water-soluble copper salts can be used singly, or may be used in combination of two or more of these, while it is preferred to use them singly from the viewpoint of concentration control.

When copper sulfate is used as a water-soluble copper salt, the concentration thereof is preferably over 100 g/L but 200 g/L or less. Further, the concentration of sulfuric acid is preferably 100 g/L to 300 g/L. As the polymer having the activities of both of a brightener and a leveler, there can be a copolymer of diallylmethylamine addition salt and sulfur dioxide, the copolymer comprising a diallylmethylamine addition salt constituent unit of the general formula (I),

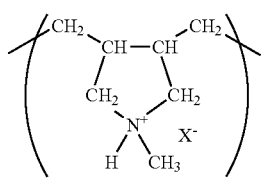

wherein X⁻ is a counter ion, and a sulfur dioxide constituent unit of the following formula (II),

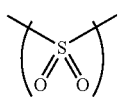

The ratio of the diallylmethylamine addition salt constituent unit (I) and the sulfur dioxide constituent unit (II) is preferably 1:(0.1~1). The molecular weight of the copolymer of diallylmethylamine addition salt and sulfur dioxide for use in this invention is not specially limited so long as it is water-soluble. For example, it is 800 to 100,000 (the molecular weight measurement is based on a GPO method using polyethylene glycol as a standard substance, i.e., a molecular weight measurement method described in JP 11-263813 A).

Examples of the counter ion X⁻ in the diallylmethylamine addition salt constituent unit of the above general formula (I) include chlorine ion, bromine ion and iodine ion, while chlorine ion is particularly preferred in that chlorine ion as an additive component to the acidic copper plating can be omitted.

For facilitating the adjustments of component concentrations in the acidic copper plating bath, fewer additives in kind are preferred. An acidic copper plating bath is preferably used which comprises, as components, only a water-soluble copper salt, sulfuric acid and a filling additive that is a polymer having the activities of both of a brightener and a leveler.

In this invention, when additives other than the water-soluble copper salt, the sulfuric acid and the filling additive are added to the acidic copper plating bath, one or more but three or less components selected from a brightener, a carrier, chloride ion and a leveler may be added. One or two components other than the above filling additive are preferred from the viewpoint of concentration control, while three components may be added.

The brightener is not specially limited so long as it is a brightener that is known to be used for electro copper plating for non-through hole filling. Examples of the brightener include bissulfoalkane sulfonate, sulfoalkyl sulfonate, a dithiocarbamic acid derivative and bis-(sulfoalkyl)disulfide salt. When the brightener is added in this invention, generally, the concentration thereof is preferably 0.01 to 100 mg/L, more preferably 0.02 to 20 mg/L, most preferably 0.03 to 10 mg/L.

The carrier is not specially limited so long as it is a carrier that is known to be used for electro copper plating for non-through hole filling. Examples of the carrier include polyethylene glycol, polypropylene glycol and a copolymer of ethylene glycol and propylene glycol. When the carrier is added in this invention, generally, the concentration thereof is preferably 0.001 to 1,000 mg/L.

The leveler is not specially limited so long as it is a leveler that is known to be used for electro copper plating for non-through hole filling. Examples of the leveler include poly(N-vinyl-N-methylimidazolium chloride), poly(N-vinylpyrolidone), poly(diallyldimethylammonium chloride) and Janus green•B. When the leveler is added in this invention, generally, the concentration thereof is preferably 0.001 to 100 mg/L. In this invention, it is preferred to add no leveler other than the above filling additive.

When the conductivity-rendered substrate is copper-plated in the above acidic copper plating bath to fill copper in a non-through hole on the substrate, electroplating can be carried out with DC or PR current according to the conditions of general copper plating with a water-soluble salt such as copper sulfate, etc. That is, the bath temperature can be room temperature, preferably approximately 23 to 27° C., and the current density is preferably for example, 2 to 100 mA/cm². The time period for the plating differs depending upon the diameter, depth, etc., of a hole, while it is, for example, 20 to 300 minutes long. For stirring, there can be employed a generally employed method, such as aeration, jetting, squeegee, etc. Further, the anode is not specially limited so long as it is a known anode, while a soluble anode such as a copper plate and an insoluble anode can be also used. The cathode is not specially limited so long as it is a known cathode, while a copper plate of tough pitch copper can be used.

EXAMPLES

Example 1 and Comparative Examples 1~4

Substrates obtained by laminating a 40 μm thick dry film resist on a 35 μm thick copper foil each was used. Via hole substrates were prepared by forming 900 via holes having a width of 50 μm, a depth of 40 μm and an aspect ratio of 0.8 each thereon according to photolithography. Then, a 0.1 μm thick Au thin film was formed on each substrate by Au sputtering to obtain a conductivity-rendered substrate. Example 1 used a 1:1 copolymer (molecular weight 4,000) of diallylmethylamine hydrochloride and sulfur dioxide as an additive. Comparative Example 1 used no additive. Comparative Example 2 used a homopolymer (molecular weight 8500) of polydiallyldimethylammonium chloride as an additive. Comparative Example 3 used a copolymer (molecular weight 4,000) of diallyldimethylammonium chloride and sulfur dioxide as an additive. Acidic electro copper plating baths having the following compositions were prepared, and the above conductivity-rendered via hole substrates were subjected to via filling plating under the following conditions.

(Compositions of Acidic Copper Plating Baths)

| | | |
|---|---|---|
| Copper sulfate | 130 g/L | |
| Sulfuric acid | 200 g/L | |
| Additive | 50 mg/L (Example 1 and Comparative Examples 2-4) or 0 mg/L (Comparative Example 1) | |

(Via Hole Filling Plating Conditions)

| | |
|---|---|
| Cathode current density | 10 mA/cm² |
| Bath temperature | Room temperature |
| Stirring speed | 1,000 rpm (stirred with a stirrer) |
| Anode | Phosphorus-containing copper plate |
| Plating time period | 90 minutes |

Figure 2:
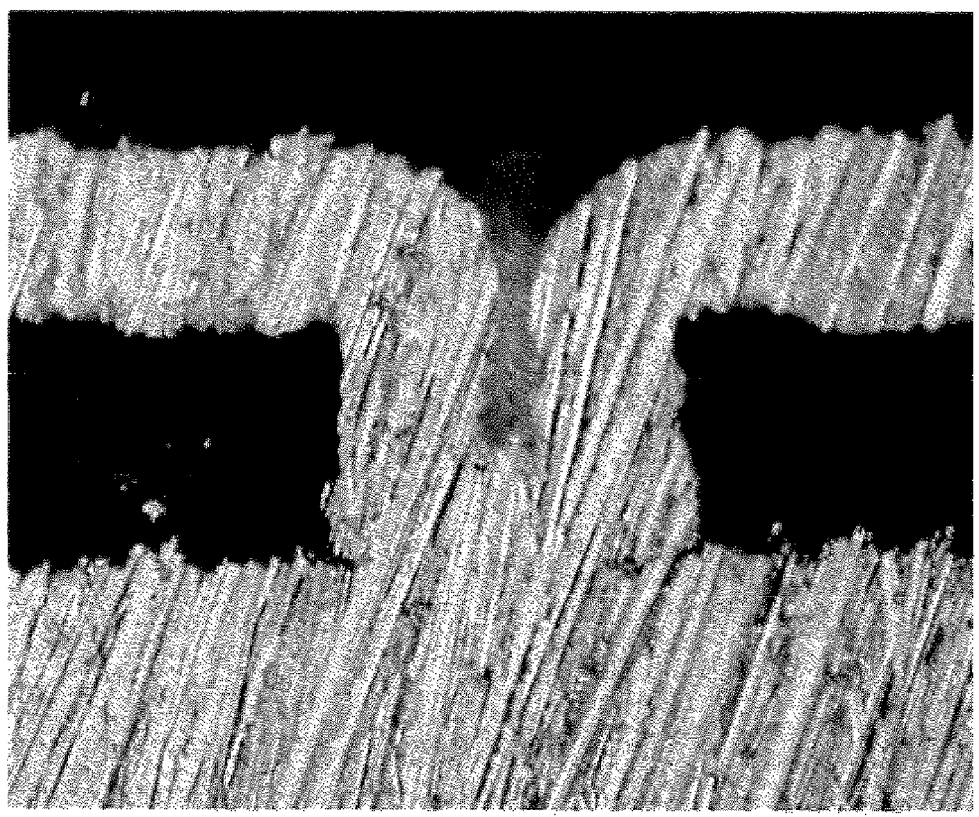
FIG. 2 is a photograph of a cross section of a copper plating when copper was filled in a non-through hole on a substrate without using an additive in Comparative Example 1.
Figure 3:
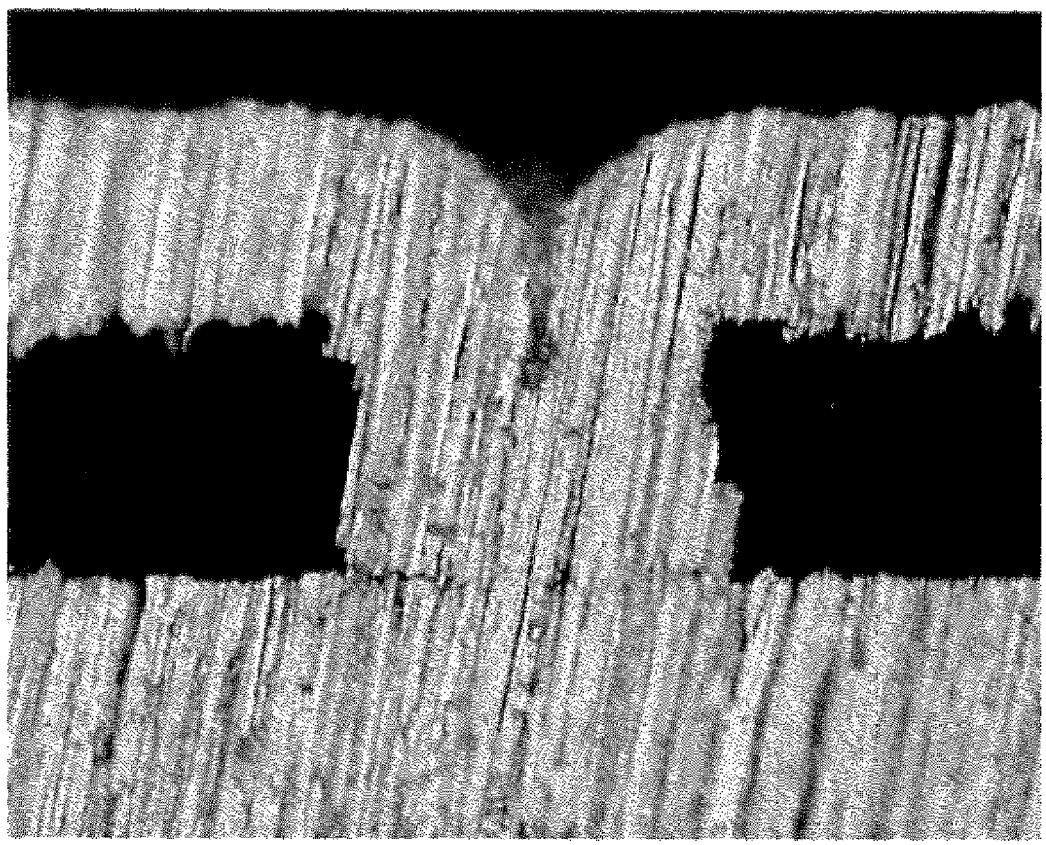
FIG. 3 is a photograph of a cross section of a copper plating when copper was filled in a non-through hole on a substrate by the use, as an additive, of a homopolymer (molecular weight 8,500) of polydiallyldimethylammonium chloride in Comparative Example 2.
Figure 4:
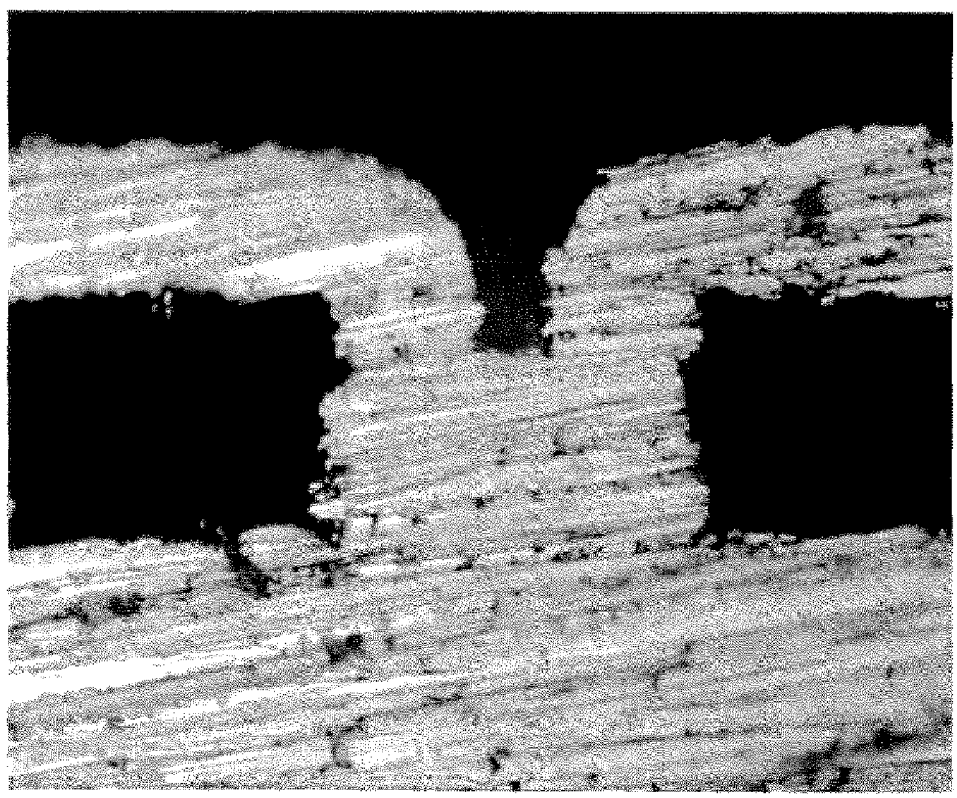
FIG. 4 is a photograph of a cross section of a copper plating when copper was filled in a non-through hole on a substrate by the use, as an additive, of a 1:1 copolymer (molecular weight 4,000) of diallyldimethylammonium chloride and sulfur dioxide in Comparative Example 3.

Then, for evaluating the via hole filling state, the via hole (opening) was cut, and the cross-section was mirror-polished and observed through an optical microscope. Table 1 shows the results. Photographs of the thus-obtained cross sections are shown in FIG. 1 (Example 1), FIG. 2 (Comparative Example 1), FIG. 3 (Comparative Example 2) and FIG. 4 (Comparative Example 3).

As is clear in Table 1 and FIGS. 1 to 4, in Example 1, the bottom portion of the via hole had a plating thickness of as thick as 34.1 μm and the substrate surface had a plating thickness of as thin as 7.3 μm. The ratio of the plating thickness of bottom portion/plating thickness on substrate surface was 4.7, so that the filling form was excellent.

On the other hand, in Comparative Examples 1 to 3, the bottom portions of the via holes had a small plating thickness, and the substrate surfaces had a large plating thickness. The ratio of the plating thickness of bottom portion/plating thickness on substrate surface was 0.62~1.20, so that the filling form each was defective.

On the basis of the results of the above Example and Comparative Examples, it has been found that in the method of filling copper according to this invention, the filling form is excellent, and not only the plating thickness in the bottom portion of via holes is sufficient, but also the thickness of a plating on the substrate surface is small, so that the via hole filling properties are remarkable.

TABLE 1

Evaluation Results

| | Via hole (50 μmϕ-d40 μm) Plating thickness in hone bottom portion (μm) | Plating thickness on substrate surface (μm) | Ratio of plating thickness of hole bottom portion/plating thickness on substrate surface | Filling form |
|---|---|---|---|---|
| Example 1 | 34.1 | 7.3 | 4.7 | Excellent |
| CEx. 1 | 15.1 | 24.4 | 0.62 | Defective |
| CEx. 2 | 24.4 | 30.2 | 0.81 | Defective |
| CEx. 3 | 29.3 | 24.4 | 1.20 | Defective |

CEx. = Comparative Example

Industrial Utility

According to this invention, copper can be well filled in non-through holes on a conductivity-rendered substrate with a copper plating bath containing fewer additives. Therefore, the concentrations of the additives in the copper plating bath can be easily controlled, and copper can be efficiently filled in non-through holes on a substrate.

The invention claimed is:

1. A method of filling copper in a non-through hole on a substrate that has been treated to render it conductive, the method comprises plating said substrate in an acidic copper plating bath comprising a water-soluble copper salt, sulfuric acid and a filling additive that is a polymer having the activities of both of a brightener and a leveler, wherein said filling additive is a copolymer of diallylmethylamine addition salt and sulfur dioxide, the copolymer comprising a diallylmethylamine addition salt constituent unit of the general formula (I),

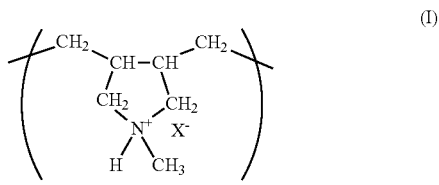

wherein X⁻ is a counter ion,
and a sulfur dioxide constituent unit of the formula (II),

2. The method of filling copper as recited in claim 1, wherein said acidic copper plating bath substantially does not contain at least one selected from a brightener, a carrier and a leveler besides said filling additive.

3. The method of filling copper as recited in claim 1, wherein said acidic copper plating bath contains over 100 g/L but 200 g/L or less of copper sulfate as water-soluble copper salt and 100 g/L to 300 g/L of sulfuric acid.

4. The method of filling copper as recited in claim 1, wherein said non-through hole is a via hole.

5. The method of filling copper as recited in claim 1, wherein said via hole has a hole diameter of 30 μm to 300 μm and has an aspect ratio (hole depth/hole diameter) of 0.3 to 1.5.

6. The method of filling copper as recited in claim 1, wherein X⁻ in said general formula (I) is chloride ion.

7. The method of filling copper as recited in claim 1, wherein said acidic copper plating bath contains no chloride ion.

* * * * *